United States Patent
Prechtl et al.

(10) Patent No.: US 9,960,157 B2
(45) Date of Patent: May 1, 2018

(54) BIDIRECTIONAL NORMALLY-OFF III-V HIGH ELECTRON MOBILITY TRANSISTOR (HEMT)DEVICES AND CIRCUITS

(71) Applicant: Infineon Technologies Austria AG, Villach (AT)

(72) Inventors: Gerhard Prechtl, Rosegg (AT); Bernhard Zojer, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days. days.

(21) Appl. No.: 14/884,388

(22) Filed: Oct. 15, 2015

(65) Prior Publication Data
US 2017/0110448 A1 Apr. 20, 2017

(51) Int. Cl.
| | |
|---|---|
| H01L 27/06 | (2006.01) |
| H01L 21/8258 | (2006.01) |
| H01L 29/423 | (2006.01) |
| H01L 29/778 | (2006.01) |
| H01L 27/088 | (2006.01) |
| H01L 27/085 | (2006.01) |
| H01L 29/08 | (2006.01) |
| H01L 29/20 | (2006.01) |

(52) U.S. Cl.
CPC ...... *H01L 27/0629* (2013.01); *H01L 21/8258* (2013.01); *H01L 27/0694* (2013.01); *H01L 27/0883* (2013.01); *H01L 29/42316* (2013.01); *H01L 29/7787* (2013.01); *H01L 27/085* (2013.01); *H01L 29/0843* (2013.01); *H01L 29/2003* (2013.01); *H03K 2217/0054* (2013.01)

(58) Field of Classification Search
CPC .................................................. H01L 27/0629
See application file for complete search history.

(56) References Cited

U.S. PATENT DOCUMENTS

| | | | |
|---|---|---|---|
| 7,777,553 B2 | 8/2010 | Friedrichs | |
| 7,875,907 B2 | 1/2011 | Honea et al. | |
| 2006/0072355 A1* | 4/2006 | Ebihara | G06K 9/0002 365/149 |
| 2009/0065810 A1* | 3/2009 | Honea | H01L 27/0605 257/192 |

(Continued)

FOREIGN PATENT DOCUMENTS

DE 102006029928 B3 9/2007

OTHER PUBLICATIONS

Eastman, L. F., et al., "Undoped AlGaN/GaN HEMTs for Microwave Power Amplification," IEEE Transactions on Electron Devices, vol. 48, No. 3, Mar. 2001, pp. 479-485.

(Continued)

*Primary Examiner* — Bilkis Jahan
(74) *Attorney, Agent, or Firm* — Slater Matsil, LLP

(57) ABSTRACT

Circuits and devices for bidirectional normally-off switches are described. A circuit for a bidirectional normally-off switch includes a depletion mode transistor and an enhancement mode transistor. The depletion mode transistor includes a first source/drain node, a second source/drain node, a first gate, and a second gate. The enhancement mode transistor includes a third source/drain node and a fourth source/drain node, and a third gate. The third source/drain node is coupled to the first source/drain node.

30 Claims, 11 Drawing Sheets

(56) References Cited

U.S. PATENT DOCUMENTS

| | | | |
|---|---|---|---|
| 2009/0167411 A1* | 7/2009 | Machida | H01L 27/0605 327/427 |
| 2014/0091852 A1* | 4/2014 | Norling | H03K 17/102 327/409 |
| 2014/0175453 A1* | 6/2014 | Yamada | H01L 29/7785 257/76 |
| 2015/0060875 A1* | 3/2015 | Kume | H01L 29/7835 257/76 |
| 2016/0322485 A1* | 11/2016 | Padmanabhan | H01L 29/747 |

OTHER PUBLICATIONS

Kim, H. N., "Qualitative and Quantative Characterization of Trapping Effects in AlGaN/GaN High Electron Mobility Transistors," Dissertation, received Aug. 19, 2015, 229 pages.

Lee, J., et al., "Growth and Device Performance of AlGaN/GaN Heterostructure with AlSiC Precoverage on Sllicon Substrate," Advances in Materials Science and Engineering, vol. 2014, Article ID 290646, 6 pages.

Lu, B., et al., "Breakdown Mechanism in AlGaN/GaN HEMTs on Si Substrate," Institute of Electrical and Electronics Engineers (IEEE), Aug. 19, 2015, 3 pages.

Marron, T., " GaN Based FETs for Power Switching Applications," Semiconductor Device and Models II, Mar. 13, 2010, 10 pages.

Mishra, U. K., et al., "GaN-Based RF Power Devices and Amplifiers," Proceeding of the IEEE, vol. 96, No. 2, Feb. 2008, pp. 287-305.

Morita, T., et al., "650V 3.1Ωcm2 GaN-based Monolithic Bidirectional Switch Using Normally-off, Gate Injection Transistor," Electron Devices Meeting, Dec. 10-12, 2007, pp. 865-868.

Pengelly, R. S., et al., "A Review of GaN on SiC High Electron-Mobility Power Transistors and MMICs," IEEE Transactions on Microwave Theory and Techniques, vol. 60, No. 6, Jun. 2012, 20 pages.

Yahaya, N. Z., "Review on Gallium Nitride HEMT Device Technology for High Frequency Converter Applications," Journal of Power Electronics, vol. 9, No. 1, Jan. 2009, pp. 36-42.

* cited by examiner

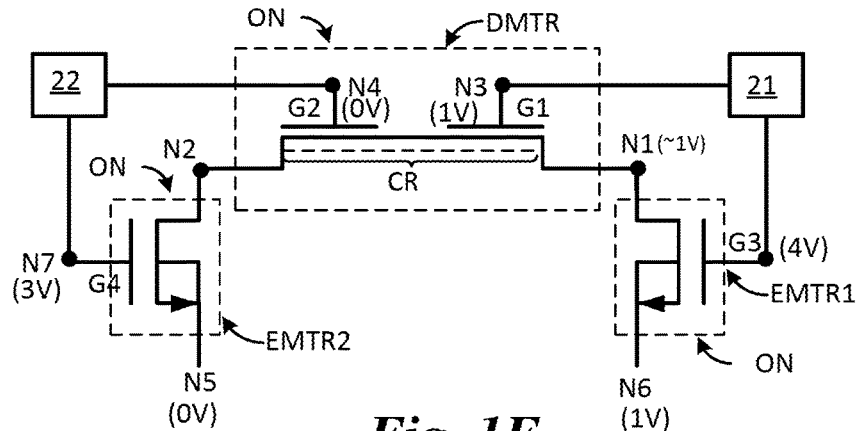
*Fig. 1F*
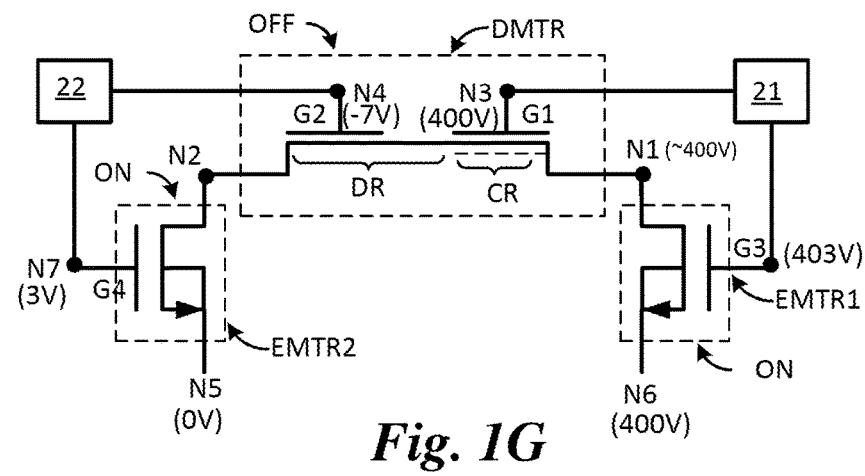
*Fig. 1G*
| | N6 | N5 | G1 | G2 | G3 | G4 | EMTR1 | EMTR2 | DMTR | Figure |
|---|---|---|---|---|---|---|---|---|---|---|
| SAFE MODE | 400V | 0V | 400V | 0V | 400V | 0V | D-ON | OFF | OFF | 1E |
| NORMAL MODE ON | 1V | 0V | 1V | 0V | 4V | 3V | ON | ON | ON | 1F |
| NORMAL MODE OFF | 400V | 0V | 400V | -7V | 403V | 3V | ON | ON | OFF | 1G |
*Fig. 1H*

BIDIRECTIONAL NORMALLY-OFF III-V HIGH ELECTRON MOBILITY TRANSISTOR (HEMT) DEVICES AND CIRCUITS

TECHNICAL FIELD

The present invention relates generally to semiconductor devices and circuits, and, in particular embodiments, to bidirectional normally-off devices and circuits.

BACKGROUND

Field effect transistors are broadly classified as depletion mode or enhancement mode transistors based on whether the transistor is in ON state or in OFF state at zero gate-to-source voltage. Enhancement-mode field effect transistors are commonly used in most circuits. Enhancement-mode field effect transistors are normally OFF when gate-to-source voltage is zero and are turned to an ON state by moving the gate relative to the source voltage towards the drain voltage, e.g., to a positive potential for a transistor with an n-type conductive channel. In biasing the gate, the conduction of the channel is enhanced and hence these devices are usually referred to as enhancement-mode devices.

In contrast, depletion-mode field effect transistors are normally ON when gate-to-source voltage is at zero and are turned to OFF state by moving the gate relative to the source voltage, e.g., to a negative potential for a transistor with an n-type conductive channel. In the OFF state, the conductive channel is depleted and hence these devices are usually referred to as depletion-mode devices.

High electron mobility transistors (HEMTs), which are also referred to as heterostructure FETs (HFETs) or modulation-doped FETs (MODFETs), are one type of depletion mode device because a current flows between source and drain terminals of the device when the gate electrode is grounded. HEMTs are typically transistors comprising III-V materials and have a two dimensional electron gas layer in an unbiased state. That is, a thin electrically conductive channel (inversion layer) exists between the source and drain terminals prior to application of any gate voltage. As such, the device is commonly referred to as being normally-on device.

SUMMARY

In accordance with an embodiment of the present invention, a circuit comprises a depletion mode transistor comprising a first source/drain node, a second source/drain node, a first gate, and a second gate. The circuit further includes a first enhancement mode transistor comprising a third source/drain node and a fourth source/drain node, and a third gate, wherein the third source/drain node is coupled to the first source/drain node.

In further embodiments, the fourth source/drain node is coupled to a first side potential node. In another embodiment, the circuit further includes a first diode coupled between the first gate and the first side potential node. In one embodiment, the first enhancement mode transistor includes a p-type field effect transistor. In one embodiment, the depletion mode transistor is a high electron mobility transistor. In one embodiment, the first enhancement mode transistor includes an n-type silicon field effect transistor or a normally off III-V transistor. In one or more embodiments, the circuit further includes a first schottky diode coupled between the third source/drain node and the fourth source/drain node.

In one or more embodiments, the circuit further includes a second enhancement mode transistor including a fifth source/drain node and a sixth source/drain node, and a fourth gate, where the fifth source/drain node is coupled to the second source/drain node. In one embodiment, the sixth source/drain node is coupled to a second potential node, and the circuit further includes a second diode coupled between the second gate and a second potential node. The first, the second, the third, and the fourth gates are coupled to different potential nodes that are configured to be independently controlled. In one embodiment, the third gate and the first gate are coupled to separate potential nodes of a first controller, and the fourth gate and the second gate are coupled to separate potential nodes of a second controller. In one embodiment, the first controller and the second controller are part of an integrated controller.

In accordance with an embodiment of the present invention, a semiconductor device comprises a normally-on transistor comprising a first source/drain node, a second source/drain node, a first gate, and a second gate. The semiconductor device also includes a first normally-off transistor and a second normally-off transistor. The first normally-off transistor comprises a third source/drain node and a fourth source/drain node, and a third gate. The third source/drain node is coupled to the first source/drain node. The second normally-off transistor comprises a fifth source/drain node and a sixth source/drain node, and a fourth gate. The fifth source/drain node is coupled to the second source/drain node.

In further embodiments, the first, the second, the third, and the fourth gates are coupled to different potential nodes that are independently controlled. In one embodiment, the third gate and the first gate are coupled to separate potential nodes of a first controller, and the fourth gate and the second gate are coupled to separate potential nodes of a second controller.

In one or more embodiments, the fourth source/drain node is coupled to a first side potential node, and the sixth source/drain node is coupled to a second side potential node. In an embodiment, the semiconductor device further includes a first diode coupled between the first gate and the first side potential node and a second diode coupled between the second gate and the second side potential node. The first normally-off transistor and the second normally-off transistor may include p-type field effect transistors.

In another embodiment, each of the first normally-off transistor and the second normally-off transistor includes an n-type field effect transistor. In one embodiment, the normally-on transistor is disposed in or over a first substrate, and the first normally-off transistor is disposed in or over a second substrate different from the first substrate. In another embodiment, the normally-on transistor and the first normally-off transistor are disposed in or over a same substrate.

In accordance with an embodiment of the present invention, a semiconductor device comprises an III-V high electron mobility transistor (HEMT) including a first source/drain node, a second source/drain node, a first gate, and a second gate. A first field effect transistor (FET) includes a first silicon substrate, a third source/drain node and a fourth source/node, and a third gat. The third source/drain node is coupled to the first source/drain node. A second FET includes a second silicon substrate, a fifth source/drain node and a sixth source/node, and a fourth gate, wherein the fifth source/drain node is coupled to the second source/drain node.

In further embodiments, the first, the second, the third, and the fourth gates are coupled to different potential nodes that are independently controlled. In one embodiment, the first silicon substrate and the second silicon substrate are a same substrate. In one embodiment, the III-V HEMT is formed on the same substrate. In one embodiment, the III-V HEMT is a GaN device comprising an AlGaN/GaN material stack. In one embodiment, the first FET and the second FET comprise silicon FETs or GaN MOSFETs.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1B and 1C illustrate the application of the bias in the two directions of blocking state of the bidirectional switching circuit in accordance with an embodiment of the present invention, wherein FIG. 1C illustrates blocking a voltage of opposite polarity compared to that illustrated in FIG. 1B;

FIG. 1F illustrates an operational aspect of the bidirectional switching circuit comprising a normally-on device coupled to a low voltage transistor in the ON state in accordance with an embodiment of the present invention;

FIG. 1G illustrates an operational aspect of the bidirectional switching circuit comprising a normally-on device in the OFF state (operation mode) coupled to a low voltage transistor in the ON state in accordance with an embodiment of the present invention;

FIG. 1H illustrates an operation scheme of the bidirectional switch in accordance with various embodiments of the present invention;

FIG. 2B illustrates a bidirectional switching showing a top view of a HEMT device in accordance with an embodiment of the present invention, wherein FIG. 2B illustrates the top view of the device illustrated in FIG. 2A in accordance with one embodiment;

FIGS. 5A and 5B illustrate a bidirectional switching circuit comprising a normally-on device with additional Schottky diodes in accordance with an embodiment of the present invention, wherein FIG. 5A illustrates n-type low voltage transistors while FIG. 5B illustrates p-type low voltage transistors;

FIG. 6A and 6B illustrates a bidirectional switching showing a top view of a HEMT device in accordance with an embodiment of the present invention, wherein FIG. 6A illustrates use of n-type low voltage transistors while FIG. 6B illustrates use of p-type low voltage transistors;

DETAILED DESCRIPTION OF ILLUSTRATIVE EMBODIMENTS

A semiconductor bidirectional power switch, which can block voltages of both polarities and conduct current in either direction, has many potential applications in modern power conversion applications such as matrix converters.

However, high voltage switching applications have very stringent requirements. For example, the tradeoff between specific ON resistance and breakdown voltage is a critical design tradeoff. Additionally, power switching devices have to be normally off for safety and reliability purposes.

An ideal candidate for a true bidirectional power switch is a lateral geometry Field Effect Transistor (FET). Although the FET design has been known for many years, no high power bidirectional power switch has been demonstrated because these devices are typically made of Silicon or GaAs materials, and therefore have low breakdown voltages and/or high on-resistances.

A potential novel material system to provide lateral FETs with low on resistance and high breakdown voltages is an AlGaN/GaN HEMT. The normally-on feature of HEMTs is an intrinsic property of gallium nitride (GaN) technology, and restricts the range of applications for GaN technology to those applications where a power supply is available to generate the negative voltages necessary to turn the GaN device off. Moreover, the normally-on feature complicates the design of the circuitry needed to drive GaN transistors. In particular, unintended short-circuits may occur due to the normally-on property of such transistors. The same problem arises with semiconductor components based on semiconductor materials other than GaN that form normally-on devices.

Normally-off GaN HEMTs have been designed, for example, using two gates sharing the gate-to-drain distance in each direction. An inherent drawback of the normally-off GaN concept is an increased on-resistance. Thus for low-ohmic (10 mOhm) high voltage switches (600 V) normally-on based concepts may be preferable. However, the circuits commonly used to achieve normally-off behavior of a normally-on switch (cascode) can increase the switching capacitance significantly.

Embodiments of the present invention overcome these issues by using low voltage transistors that are permanently in "on" state during normal operation of the HEMT device so that these transistors do not switch during normal operation of the bidirectional switch. However, when the negative voltage for switching off the HEMT is not available, a safe mode of operation exists by switching off the low voltage transistor.

Accordingly, in various embodiments, a bidirectional switch based on a normally-on GaN HEMT is described. Embodiments of the present invention use two low voltage transistors to ensure normally-off behavior of the normally-on GaN HEMT. The low voltage transistors are normally-off devices that are always in ON state during normal operation of the switch. Therefore, the low voltage transistors do not contribute to the switching of the HEMT device.

Figure 1A:
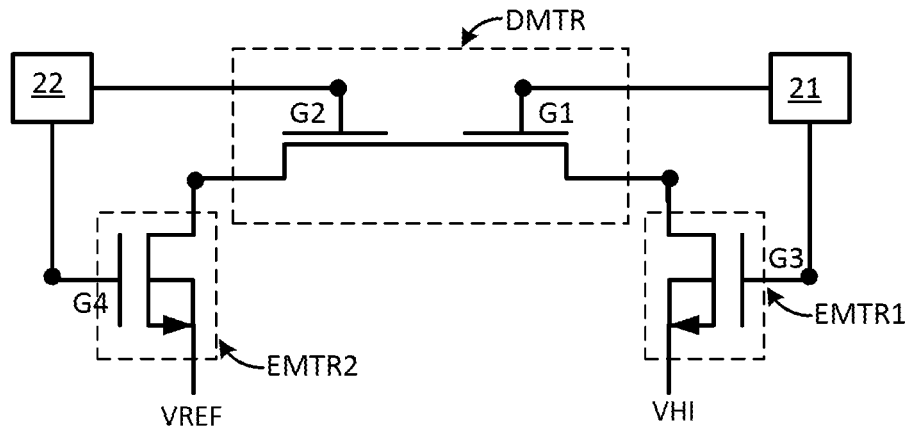
FIG. 1A illustrates a bidirectional switching circuit comprising a normally-on device in accordance with an embodiment of the present invention.

FIG. 1A illustrates a bidirectional switching circuit comprising a normally-on device in combination with low voltage transistors in accordance with an embodiment of the present invention.

Referring to FIG. 1A, the semiconductor circuit comprises a bidirectional depletion mode transistor DMTR (normally-on transistor) coupled between a first side transistor EMTR1 and a second side transistor EMTR2. For illustration, the first side transistor EMTR1 will be described as a high side transistor. However, the circuit is symmetric and bidirectional and therefore these functions are interchangeable.

The DMTR includes a source/drain node and a drain/source node, which may be symmetric. Further, the DMTR includes a first gate G1 and a second gate G2, which are coupled to different nodes. For example, in one embodiment, the first gate G1 is coupled to a first controller 21 and the second gate G2 is coupled to a second controller 22.

In various embodiments, the DMTR is a power device capable of handling large voltages, for example, operating between 100V to 2000 V. The DMTR may have a negative threshold voltage, for example, between 0V and −20 V.

The first side transistor EMTR1 includes a corresponding source/drain node and a drain/source node, and a third gate G3. The source/drain node of the EMTR1 is coupled to the source/drain node of the DMTR.

The first gate G1 and the third gate G3 are coupled to the first controller 21 so that both gates can be controlled independently.

The second side transistor EMTR2 includes a corresponding source/drain node, a drain/source node, and a fourth gate G4. The source/drain node of the EMTR2 is coupled to the other drain/source node of the DMTR.

The second gate G2 and the fourth gate G4 are coupled to the second controller 22 so that both gates can be controlled independently.

The first side transistor EMTR1 and the second side transistor EMTR2 are low voltage transistors, for example, capable of handling voltages between 1V to 20V. The first side transistor EMTR1 and the second side transistor EMTR2 may have a threshold voltage between 1V-2V in one embodiment.

Figure 1B:
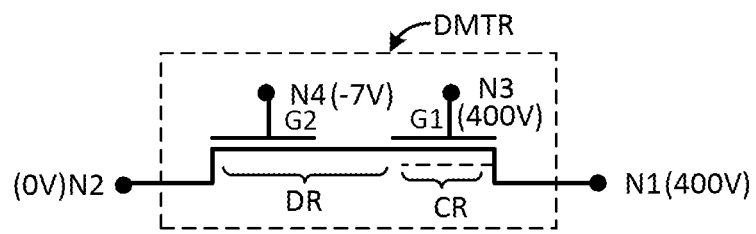
Figure 1C:
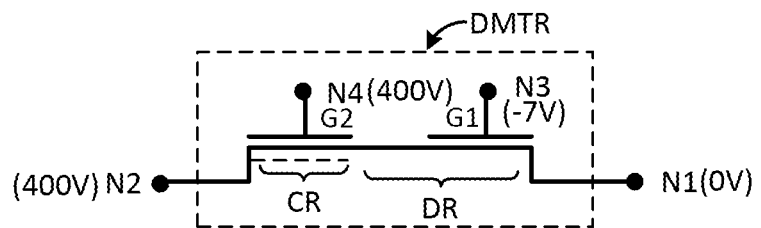

Accordingly, the DMTR is bidirectional because it can conduct currents and block voltages in both directions equally well. FIGS. 1B and 1C illustrate the two modes of blocking. For example, in FIG. 1B, the DMTR is blocking a high voltage (400V) applied at the first node N1, the second node N2 is at a low voltage (0V), the first gate G1 at the third node N3 is at the high voltage (400V), the second gate G2 at the fourth node N4 is at the low voltage N4 (−7V). In this case, the DMTR includes a conductive region CR and a drift region DR. The voltages at the fourth node N4 and the second node N2 result in a gate to source voltage of −7V, which is more negative than the threshold voltage. This results in partially depleting the buried channel to form a drift region DR under the second gate G2. The region under the first gate G1 may continue to be conductive so that the potential is dropped across the depleted drift region DR.

FIG. 1C illustrates conduction along the opposite direction to that illustrated in FIG. 1B. Accordingly, in this example, the second node N2 and the second gate G2 are held at a high voltage, e.g., 400 V while the first node N1 and the first gate G1 are held at a low voltage, e.g., 0 V and −7V, respectively.

The operation of the bidirectional switch will be described using FIGS. 1D-1H. As will be apparent from the description below, only the normally-on transistor is switched during operation while the low voltage transistors (first side transistor EMTR1 and the second side transistor EMTR2) are permanently in "on" state during normal operation. If the drive voltage is not sufficiently negative to safely switch "off" the high voltage part, e.g., during start-up and failure conditions, the low voltage transistors (first side transistor EMTR1 and the second side transistor EMTR2) are able to take over the safety functions by switching off the normally-on device as described further in FIG. 1D.

Figure 1D:
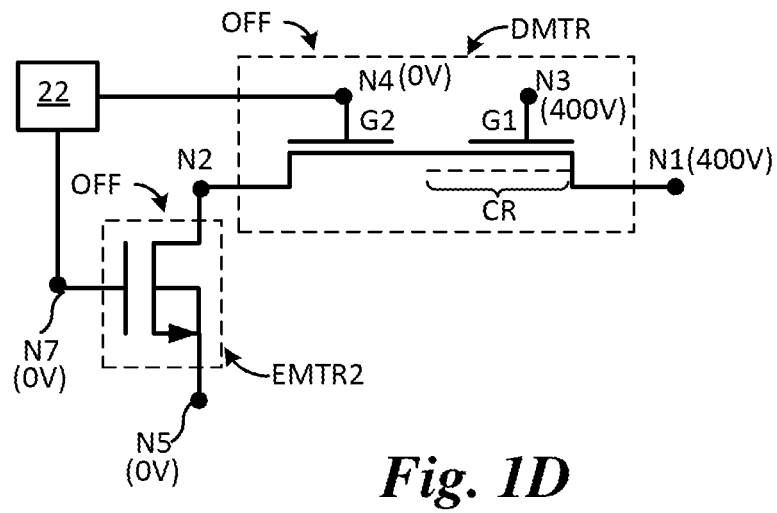
FIG. 1D illustrates an operational aspect of the bidirectional switching circuit comprising a normally-on device coupled to a low voltage transistor in the OFF state (safe mode) in accordance with an embodiment of the present invention.

FIG. 1D illustrates an operational aspect of the bidirectional switching circuit comprising a normally-on device coupled to a low voltage transistor in the OFF state in accordance with an embodiment of the present invention.

The bidirectional switch is configured to operate in at least two modes. A safe mode in which there is no current conduction and a normal operating mode in which the DMTR is switched/toggled between the ON state and the OFF state. The safe mode requirement may be very stringent in various embodiments.

FIG. 1D illustrates the safe mode operation or the blocking state of the bidirectional circuit. For clarity only one of the low voltage transistors is illustrated. In the safe mode or OFF state, the DMTR device is not actively switched. However, because of the coupling of the low voltage transistor, the DMTR does not conduct current. Even if the DMTR is accidentally switched, it is dynamically turned into the OFF state.

Referring to FIG. 1D, as an illustration, if the first node N1 is at 400V, the third node N3 is at 400V, and the fourth node N4 is at 0V, initially the DMTR is in ON state with a conducting channel region CR. In case of electron channels, the DMTR device may operate between 100 V to 1200 V and may have negative threshold voltages in the range from −5V to about −10V.

In the illustrated configuration, the second side enhancement mode transistor EMTR2 is in an OFF state. Therefore, upon application of the high voltage (400V) at the first node N1, the voltage at the second node N2 rises (as the DMTR is still conducting while the EMTR2 does not). However, if the potential increases beyond a certain voltage, the gate-to-source voltage at the second gate G2 increases beyond the threshold voltage of the DMTR. For example, if the threshold voltage of the DMTR is −7V, when the second node N2 reaches 7V, the gate-to-source voltage at the second gate G2 reaches −7V. In particular, the DMTR switches off as the gate voltage exceeds the threshold voltage because part of the channel under the second gate becomes fully depleted (as shown by the absence of the dashed lines representing the channel region CR). Thus, the potential at the second node N2 increases until the switch is turned OFF.

Thus, the potential at the second node N2 becomes pinned to a voltage that is slightly higher than the negative threshold voltage of the DMTR and the DMTR is dynamically switched into the OFF state. Importantly, the voltage at the second node N2 does not rise above the threshold voltage of the DMTR and therefore the EMTR2 is not exposed to the otherwise high voltage at the first node N1, which would break down EMTR2. Because the DMTR is switched off, there is very little leakage current flowing through the bidirectional switching circuit.

Figure 1E:
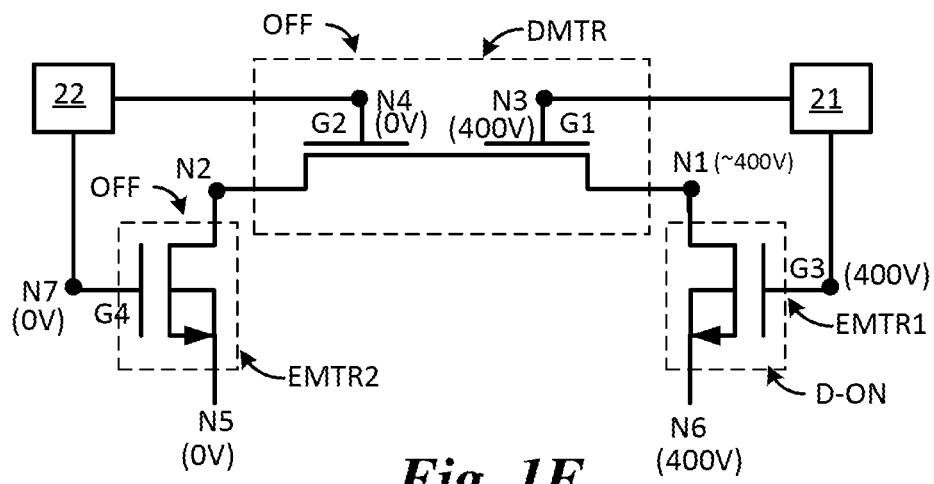
FIG. 1E illustrates an operational aspect of the bidirectional switching circuit comprising a normally-on device coupled to a low voltage transistor in the OFF state (safe mode) and a further low voltage transistor operated in reverse (diode) conduction mode (D-ON) in accordance with an embodiment of the present invention.

FIG. 1E illustrates an operational aspect of the bidirectional switching circuit comprising a normally-on device coupled to a low voltage transistor in the OFF state and another low voltage transistor in reverse (diode) operation in accordance with an embodiment of the present invention.

FIG. 1E illustrates both low voltage transistors of the bidirectional circuit. As described in FIG. 1D, the second side enhancement mode transistor EMTR2 is in the OFF state during the safe mode. Further, the first side enhancement mode transistor EMTR1 is also in the OFF state. However, the body to drain diode of EMTR1 is under forward bias and does not block the input potential. There is a small voltage drop associated with the threshold voltage (built in voltage) of the diode, which is typically about 0.7V for silicon based diodes. However, this does not change the operation of the bidirectional switch discussed above with respect to FIG. 1D.

FIG. 1F illustrates an operational aspect of the bidirectional switching circuit in the ON state comprising a normally-on device coupled to a low voltage transistor in accordance with an embodiment of the present invention.

During normal operation, the low voltage transistors such as the second side enhancement mode transistor EMTR2 is in the ON state as the fourth gate G4 of the EMTR2 is pulled up. For example, the seventh node N7 at the EMTR2 is pulled up, e.g., to 3V, which is above the threshold voltage of the device. In the ON state, both the gates of the DMTR do not deplete the conducting channel region CR. Therefore, the DMTR is in the ON state and conducts a current through the CR. In FIG. 1F, the potential at the first node N1 is only slightly lower than the potential at the sixth node N6 due to the ON resistance of the EMTR1 because the first enhancement mode transistor EMTR1 is in the ON state as the third gate G3 is at 4V.

FIG. 1G illustrates an operational aspect of the bidirectional switching circuit in the OFF state comprising a normally-on device coupled to a low voltage transistor in accordance with an embodiment of the present invention.

In this configuration, the DMTR is switched by the second controller 22 to turn OFF the DMTR. For example, the fourth node N4 may be pulled down below the threshold voltage of the DMTR (e.g., −7V) thereby depleting the channel under the second gate G2.

FIG. 1H illustrates an operation scheme of the bidirectional switch in accordance with various embodiments of the present invention.

The above described operation of the bidirectional switch is summarized in the Table of FIG. 1H. The second row of the table shows the operation of the bidirectional switch during safe mode while the third row and the fourth row show the operation during normal operating mode. In the safe mode, the first and the second gates G1 and G2 are not controlled actively while in the normal mode, the first and the second gates G1 and G2 are actively controlled. In various embodiments, as is clear from FIG. 1H, the bidirectional switch can be in the OFF state using multiple techniques. For example, as illustrated in the second row and the fourth row, the second gate G2, the fourth gate G4, or the combinations of voltages applied at the second gate G2 and the fourth gate G4 can be used to turn the switch into the OFF state.

Thus, during the switching of this device in the normal mode, only the DMTR is being switched because the other two transistors are in the ON state. Accordingly, the switching process does not introduce additional capacitances due to switching of the low voltage transistors. Thus embodiments of the present invention take advantage of the excellent Figure of Merits (FOM) of the DMTR without introducing parasitic elements.

An advantage of the above described technique and circuit is that the low voltage transistors are not switched during normal operation. Therefore, the superior figure of merit (FOM) of the normally-on DMTR is mated with the safety provided by adding the normally-off low voltage transistors.

Figure 2A:
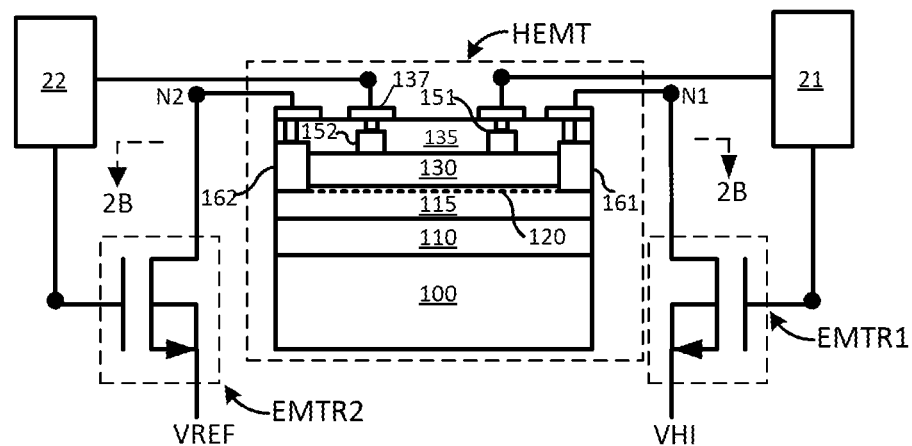
FIG. 2A illustrates a bidirectional switching device comprising a high electron mobility transistor (HEMT) coupled with low voltage transistors in accordance with an embodiment of the present invention.

FIG. 2A illustrates a bidirectional switch comprising a high electron mobility transistor (HEMT) coupled with low voltage transistors in accordance with an embodiment of the present invention. The HEMT is illustrated in a cross-sectional view.

In FIG. 2A, the DMTR of FIG. 1 is replaced with a wide bandgap (WBG) semiconductor group III-V device forming a HEMT. The HEMT includes a first source/drain region 161, a second source/drain region 162, a first gate 151, and a second gate 152. A continuous buried channel 120 is formed within the workpiece over the substrate 100.

In one embodiment, the HEMT is formed using gallium nitride (GaN) technology. GaN based devices are well suited for power switching applications due to the higher band gap, higher breakdown electric field, higher thermal conductivity, high saturated drift velocity, and high radiation tolerance. In various embodiments, the substrate 100 may be a silicon substrate including a (111) silicon, silicon on oxide (SOI), sapphire, silicon carbide, or other silicon based substrates. Alternatively, the substrate 100 may comprise other materials. The substrate 100 may also include a number of hetero-epitaxial layers.

The GaN device region may be formed using a hetero-epitaxial growth over the substrate 100. Accordingly, suitable buffer layers 110 including nucleation layers may be used. The buffer layer 110 may be a relatively thick layer, for example, about 1 µm to about 5 µm in one embodiment. In one example embodiment, a 5 nm to 20 nm nucleation or transition layer followed by a graded layer may be used. The nucleation or transition layer may comprise AN, AlGaN, AlSiN, AlSiC, SiC, GaAs, AlAs, for example. The graded layer may comprise an AlGaN layer with reducing content of aluminum.

A first layer 115 is formed over the buffer layer 110. In one embodiment, the first layer 115 may be an extension of the buffer layer 110 but may be strain relaxed and/or with less defect density than the buffer layer 110. Accordingly, in one example, the first layer 115 is an unintentionally doped (UID) GaN layer. The first layer 115 may have a thickness of about 10 nm to about 400 nm in various embodiments.

A second layer 130 is formed over the first layer 115. In various embodiments, the second layer 130 is an $Al_xGa_{1-x}N$ layer, where x may vary from 0.2 to 0.5, and 0.3 to 0.4 in one embodiment. The second layer 130 has a thickness of 5 nm to 30 nm in various embodiments. In one or more embodiments, the second layer 130 (AlGaN layer) is undoped although the second layer 130 may be doped with silicon in some embodiments. In one embodiment, the second layer 130 may comprise an undoped AlGaN contacting the undoped GaN followed by a donor doped AlGaN. An optional gallium nitride cap layer may be formed over the second layer 130 in some embodiments.

A two-dimensional electron gas (2DEG) is formed at the junction between the AlGaN/GaN heterostructure solely from spontaneous and piezoelectric induced polarization charge.

The first and the second source/drain regions 161 and 162 may include metal like regions formed by incorporating metals as well as semiconductive regions formed, for example, by using an n-type dopant (e.g., silicon).

The source/drain contacts are Ohmic contacts and are electrically coupled to the 2DEG conducting channel 120 while the first gate line 151 and the second gate line 152 are electrically separated from the conducting channel 120 by the second layer 130. Because of the potential difference between the first node N1 and the second node N2, electrons flow through the 2DEG conducting channel 120. For example, electrons from the second source/drain 162 coupled to the second node N2 flow to the first source/drain 161 coupled to the first node N1 when a potential is applied at the first node N1.

The HEMT further includes one or more layers of a protective insulation material. For example, a passivation layer 135 may be formed over the second layer 130. The passivation layer 135 may comprise silicon nitride in one embodiment. The passivation layer 135 may have a thickness of 500 nm to 2000 nm in various embodiments. Contacts pads 137 may be formed over the passivation layer 135 for electrically connecting the source, drain, and gates of the HEMT.

Figure 2B:
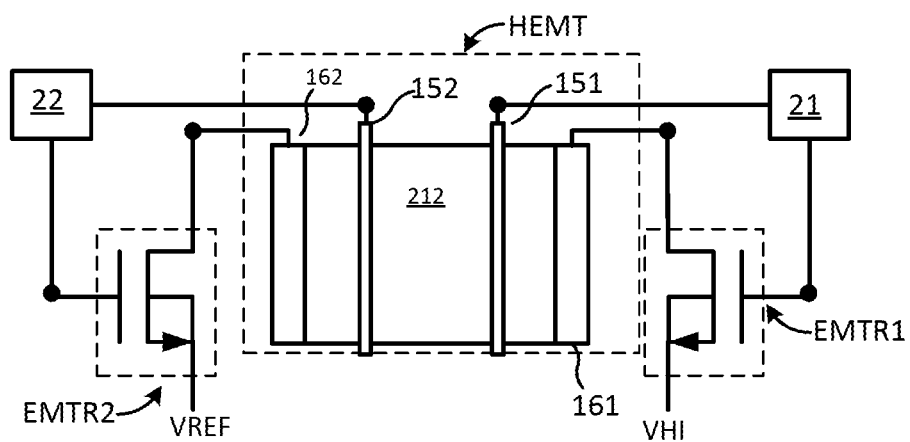

FIG. 2B illustrates a bidirectional switching showing a top view of a HEMT device in accordance with an embodiment of the present invention. FIG. 2B illustrates the top view of the device illustrated in FIG. 2A.

Referring to FIG. 2B, the HEMT device may include a first source/drain region 161 and a second source/drain region 162. The HEMT device may include a first gate line 151 and a second gate line 152 as described above. As is apparent, the HEMT device has a shared region 212, which includes the drift region over which significant portion of the voltage is dropped across the HEMT. In various embodiments, the use of two gates as described above prevents the need for forming two drift regions for bidirectional conduction.

Figure 3:
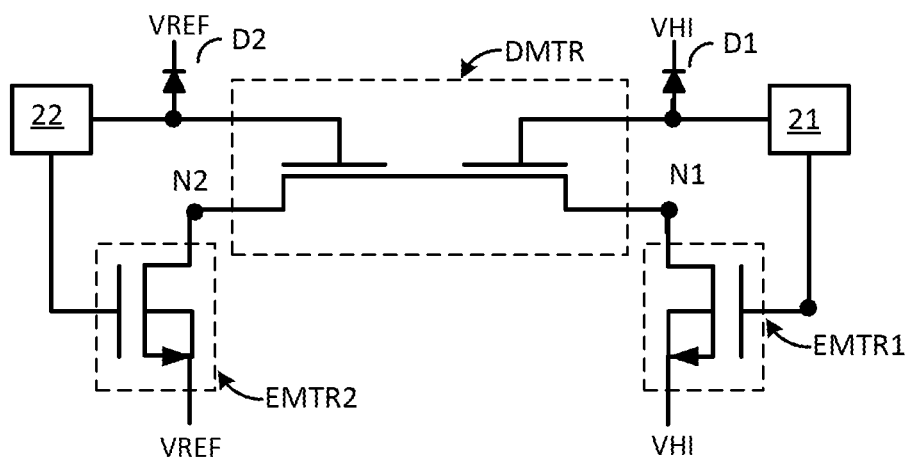
FIG. 3 illustrates a bidirectional switching circuit comprising a normally-on device with additional diodes coupled to the gates in accordance with an embodiment of the present invention.

FIG. 3 illustrates a bidirectional switching circuit comprising a normally-on device with additional diodes coupled to the gates in accordance with an embodiment of the present invention.

In some embodiments, additional diodes may be introduced between the gates of the DMTR and a source of the corresponding enhancement mode transistors so as to define the reference potential. The reference may be used to ensure that the DMTR turns off when the potential at the second node N2 rises during the safe mode operation described above. Accordingly, FIG. 3 illustrates a first diode D1 and a second diode D2 between the gates and their respective reference potentials.

Figure 4:
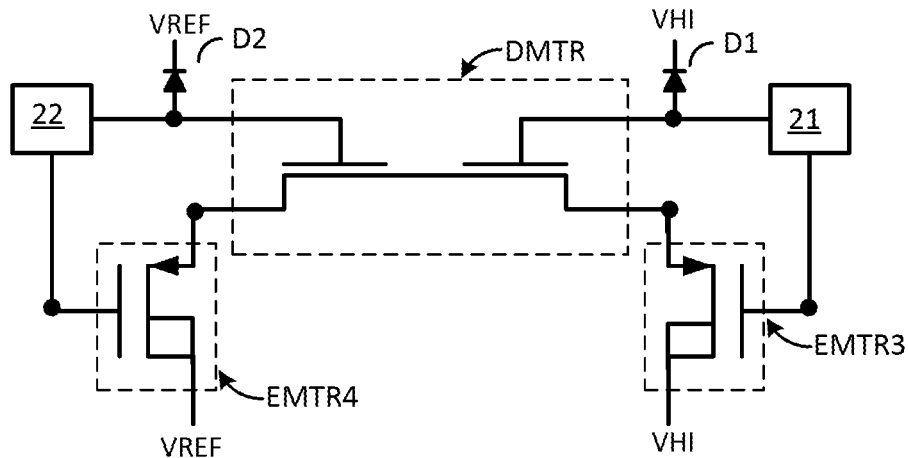
FIG. 4 illustrates a bidirectional switching circuit comprising p-type low voltage transistors coupled with normally-on device in accordance with an embodiment of the present invention.

FIG. 4 illustrates a bidirectional switching circuit comprising a p-type low voltage transistors coupled with normally-on device in accordance with an embodiment of the present invention.

Embodiments of the present invention may be implemented using n-type or p-type low voltage transistors. When p-type low voltage transistors are used as illustrated in FIG. 4, the additional diodes described in FIG. 3 become more significant. This is because the first and second controllers 21 and 22 are unable to provide this reference potential unless these diodes are integrated into the controllers as may be done in some embodiments. The operation of the first and second p-type EMTRs (EMTR3 and EMTR4) is similar to the operation of the n-type EMTRs except that the polarity of voltages is reversed.

Figure 5A:
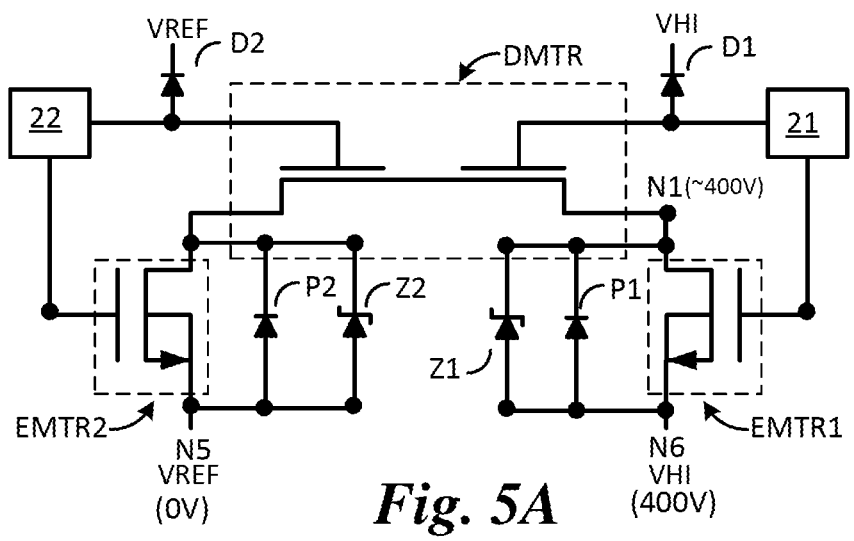
Figure 5B:
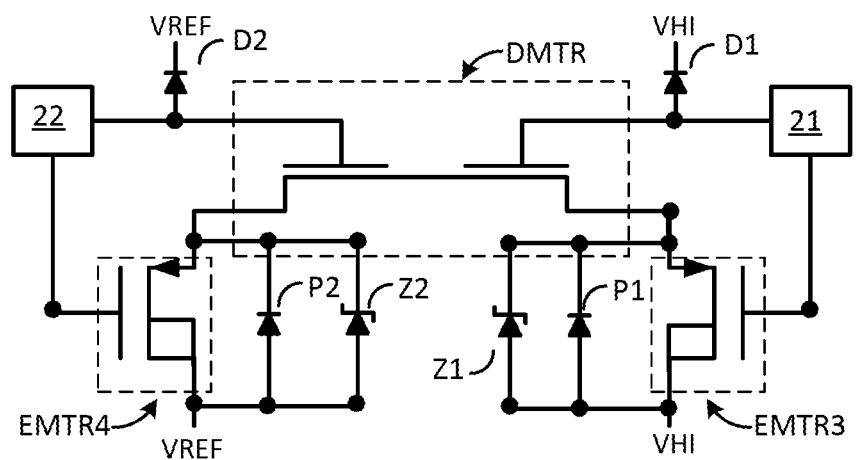

FIGS. 5A and 5B illustrates a bidirectional switching circuit comprising a normally-on device with additional Schottky diodes in accordance with an embodiment of the present invention. FIG. 5A illustrates n-type low voltage transistors while FIG. 5B illustrates p-type low voltage transistors.

FIGS. 5A and 5B illustrate the internal body diodes P1 and P2 that are integral part of the first and the second side enhancement mode transistors EMTR1 and EMTR2. The body diode introduces a voltage drop due to the built in voltage. As illustrated in FIG. 5A, when a 400V potential is applied at the sixth node N6, and the fifth node N5 is at 0V, the first diode P1 is forward biased while the second diode P2 is reverse biased.

Figure 6A:
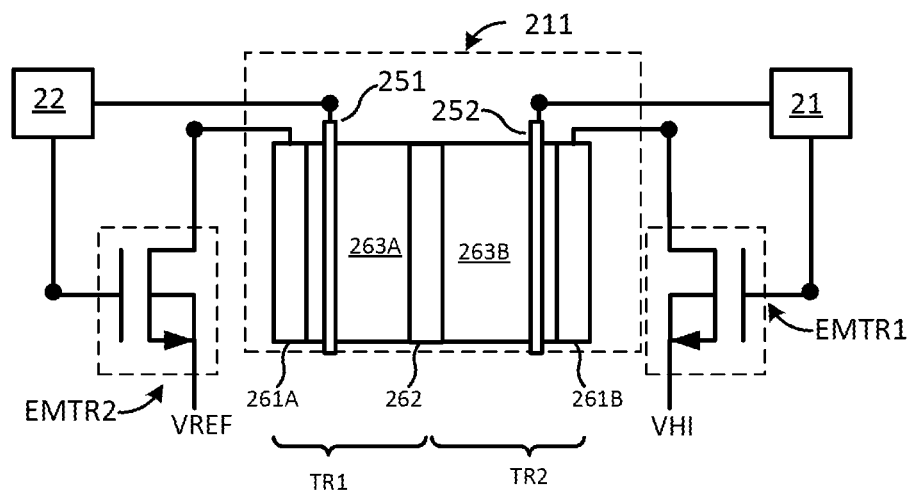
Figure 6B:
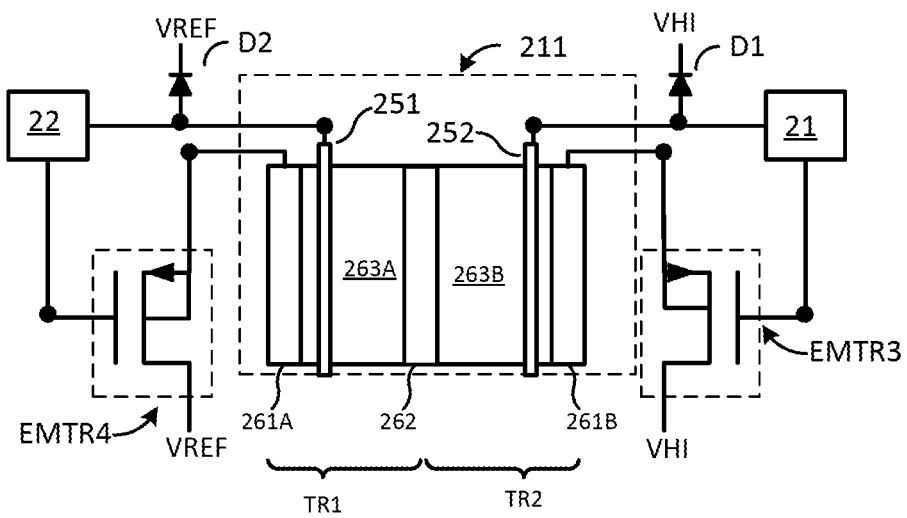

However, in further embodiments, additional diodes such as Schottky diodes Z1 and Z2 may be added in parallel to further reduce the forward voltage drop across the first and the second side enhancement mode transistors EMTR1 and EMTR2. In contrast to silicon diodes that have a threshold voltage in the range of 0.6V to 0.7V, the Schottky diodes have lower voltage drops in the range of 0.1 to 0.5 V. FIG. 6A and 6B illustrates a bidirectional switch showing a top view of a HEMT device in accordance with an embodiment of the present invention. FIG. 6A illustrates use of n-type low voltage transistors while FIG. 6B illustrates use of p-type low voltage transistors.

Referring to FIG. 6A or FIG. 6B, the HEMT device 211 includes a first source 261A, a second source 261B, and a common drain 262. Accordingly, the HEMT device 211 includes two transistors TR1 and TR2, which are both asymmetric transistors. Accordingly, in this embodiment, the HEMT device 211 includes a first drain drift zone 263A in the first transistor TR1 and a second drain drift zone 263B in the second transistor TR2. This embodiment may not be as space efficient as the prior embodiments described using a common drain drift zone (see e.g., FIG. 2B showing shared region 212).

Figure 7A:
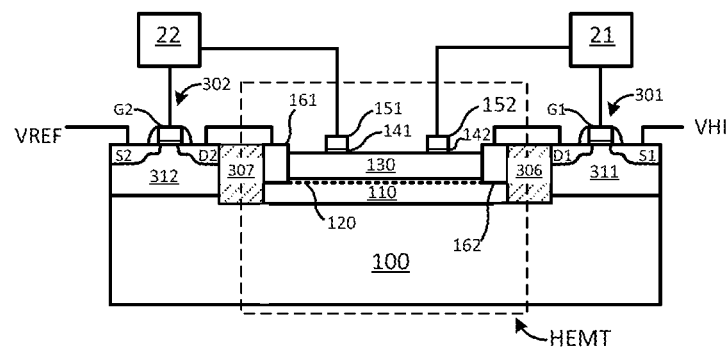
FIG. 7A illustrates an embodiment of the HEMT device and the low voltage transistors integrated in a single device.

FIG. 7A illustrates an embodiment of the HEMT device and the low voltage transistors integrated in a single device.

In various embodiments, the low voltage transistors and the HEMT may be formed on different substrates as discrete devices. For example, in one embodiment, the n-type EMTR1 and EMTR2 (discussed above) may be formed in separate substrates or may be integrated onto a single substrate. However, the EMTR1 and EMTR2 may be formed on a substrate that is separate from the substrate of the HEMT device. This is because of the different fabrication processes used to produce these two devices. For example, the HEMT device uses III-V device fabrication techniques that rely heavily on hetero-epitaxial processes and processes compatible with hetero-epitaxial processes. In contrast, the EMTR1 and EMTR2 may be formed using cost efficient silicon device fabrication technology.

However, in some embodiments, the two technologies may be combined in a mixed technology process in which a common substrate is used to form both the low voltage transistors and the HEMT device.

Referring to FIG. 7A, the first low voltage device 301 and the second low voltage device 302 are thus formed over the substrate 100 supporting the HEMT. In one embodiment, the first and the second low voltage devices 301 and 302 are n-type MOSFETs while in another embodiment the first and the second low voltage devices 301 and 302 are p-type MOSFETs.

A first isolation 306 and a second isolation 307 may be used to separate the HEMT from the first and the second low voltage devices 301 and 302. Additional isolation wells may also be used such as a first well 311 and a second well 312. The source, drain, and gate of the first and the second low voltage devices 301 and 302 are represented by the corresponding symbols (G1, G2), (S1, S2), and (D1, D2).

Figure 7B:
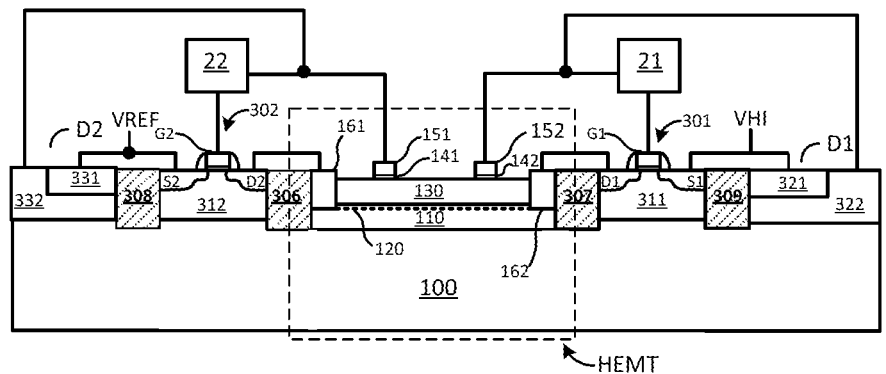
FIG. 7B illustrates a further embodiment of the bidirectional switch including the HEMT, the low voltage transistors, and diodes all integrated together.

FIG. 7B illustrates a further embodiment of the bidirectional switch including the HEMT, the low voltage transistors, and the diodes integrated together.

In this embodiment, the additional diodes may also be integrated onto the same substrate as illustrated in FIG. 7B. The diodes may be separated and isolated further using third and fourth isolations 308 and 309. For example, first diode D1 includes a first doped region 322 and a first metallic contact region 321. In one embodiment, the first metallic region 322 comprises a silicide. Similarly, the second diode D2 includes a second metallic region 331 and a fourth doped region 332.

In further embodiments, the first and the second controllers 21 and 22 may also be integrated onto the same substrate 100. Although two controllers are described in various embodiments, in other embodiments, four independent controllers may be used. Alternatively, in one embodiment, the functionality of all the controllers is integrated into a single device. However, care has to be taken to properly isolate the high voltage side (e.g., 400V) from the low voltage side (e.g., 0V or −7V).

Figure 7C:
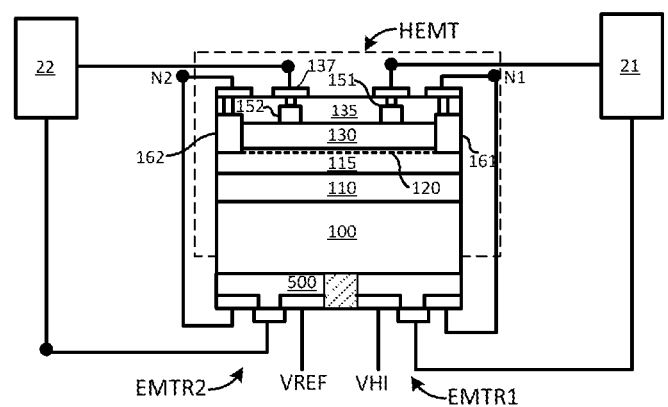
FIG. 7C illustrates an embodiment of the HEMT device and the low voltage transistors integrated in a single device in a flip chip configuration.

FIG. 7C illustrates an embodiment of the bidirectional switch including the HEMT, the normally-off transistors, and the diodes integrated together using a flip chip configuration.

In this embodiment, the substrate comprising the HEMT may be attached to a substrate 500 comprising the EMTR1 and EMTR2 to form an integrated device. For example, the substrate 100 may be a (111) silicon while the substrate 500 may be a (100) silicon. Alternatively, the substrate 500 may be a silicon on insulator substrate so that the silicon of the substrate 500 is isolated from the silicon of the substrate 100 by the insulator layer.

Figure 7D:
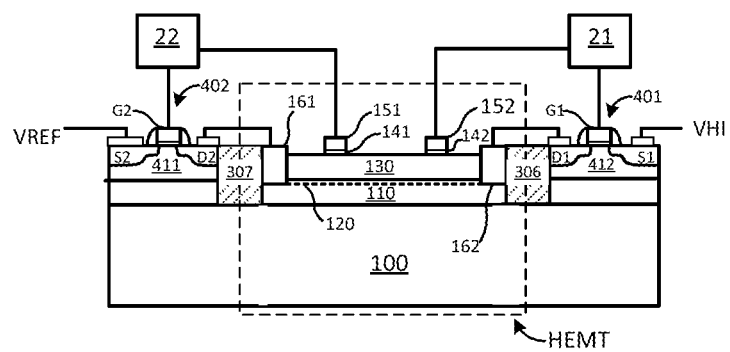
FIG. 7D illustrates a further embodiment of the bidirectional switch including the HEMT, the GaN MOS transistors, and the diodes integrated together.

FIG. 7D illustrates a further embodiment of the bidirectional switch including the HEMT, the GaN MOS transistors, and the diodes integrated together.

In another embodiment, the low voltage transistors may be formed using normally off GaN transistors. Such embodiments may allow easier integration on the same substrate 100. The use of normally off low voltage GaN transistors in combination with the normally-on GaN transistor as described in various embodiments may be advantageous over a single normally-off high voltage GaN transistor because the figure of merit (usually measured by the on resistance times the area) of a normally-off GaN transistor is not as good as for a normally-on GaN transistor. Thus the area of a low voltage normally-off GaN transistor in combination with the area of a normally-on high voltage GaN bidirectional switch can be made to be smaller than the area of a pure normally-off high voltage GaN bidirectional switch.

Referring to FIG. 7D, on the same substrate 100, the HEMT, the first side GaN MOSFET 401, and the second side GaN MOSFET 402 are formed. In alternative, embodiments, to achieve normally off low voltage GaN transistors, the gate is modified by making a gate recess into the AlGaN barrier. Alternatively, a pGaN gate is used to deplete the 2DEG below the gate. In one embodiment, an n-channel GaN MOSFET may be formed on undoped GaN or p-doped GaN in which N+ source and N+ drain are formed using implantation and annealing. In further embodiments, the first side GaN MOSFET 401, and the second side GaN MOSFET 402 may be p-type GaN MOSFETs. In such cases, the additional diodes are added between the gates and the corresponding reference potential nodes, for example, as described in FIG. 5B.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-7 may be combined with each other in alternative embodiments. It is therefore intended that the appended claims encompass any such modifications or embodiments.

What is claimed is:

1. A semiconductor device comprising:
   a bidirectional III-V high electron mobility transistor (HEMT) comprising a first source/drain node, a second source/drain node, a first gate, and a second gate isolated from the first gate, wherein the first gate is coupled to a first control node and the second gate is coupled to a second control node;
   a first field effect transistor (FET) comprising a first silicon substrate, a third source/drain node and a fourth source/drain node, and a third gate, wherein the third source/drain node is coupled to the first source/drain node, wherein the fourth source/drain node is coupled to a input/output node different from the first control node and the second control node; and
   a second FET comprising a second silicon substrate, a fifth source/drain node and a sixth source/node, and a fourth gate, wherein the fifth source/drain node is coupled to the second source/drain node.

2. The device of claim 1, wherein the first, the second, the third, and the fourth gates are coupled to different potential nodes that are independently controlled.

3. The device of claim 1, wherein the first silicon substrate and the second silicon substrate are a same substrate.

4. The device of claim 1, wherein the III-V HEMT is formed on the same substrate.

5. The device of claim 1, wherein the III-V HEMT is a GaN device comprising a AlGaN/GaN material stack.

6. The device of claim 1, wherein the first FET and the second FET comprise silicon FETs or GaN MOSFETs.

7. The device of claim 1, wherein the III-V HEMT device is a depletion mode device.

8. The device of claim 1, wherein the III-V HEMT device is a normally ON device.

9. A circuit comprising:
   a high electron mobility transistor comprising a first source/drain node, a second source/drain node, a first gate, and a second gate, wherein the high electron mobility transistor is a depletion mode transistor;
   a first enhancement mode transistor comprising a third source/drain node and a fourth source/drain node, and a third gate, wherein the third source/drain node is coupled to the first source/drain node; and
   a second enhancement mode transistor comprising a fifth source/drain node and a sixth source/drain node, and a fourth gate, wherein the fifth source/drain node is coupled to the second source/drain node, wherein the circuit is configured to operate in
a first mode in which the high electron mobility transistor is in a high resistance state, the first enhancement mode transistor is in a low resistance state, the second enhancement mode transistor is in a high resistance state,
a second mode in which the high electron mobility transistor is in a low resistance state of the high electron mobility transistor, the first enhancement mode transistor is in the low resistance state of the first enhancement mode transistor, the second enhancement mode transistor is in a low resistance state of the second enhancement mode transistor, and
a third mode in which the high electron mobility transistor is in the high resistance state of the high electron mobility transistor, the first enhancement mode transistor is in the low resistance state of the first enhancement mode transistor, the second enhancement mode transistor is in the low resistance state of the second enhancement mode transistor.

10. The circuit of claim 9, wherein the fourth source/drain node is coupled to a first side potential node.

11. The circuit of claim 10, further comprising a first diode coupled between the first gate and the first side potential node.

12. The circuit of claim 11, wherein the first enhancement mode transistor comprises a p-type field effect transistor.

13. The circuit of claim 9, wherein the first enhancement mode transistor comprises an n-type silicon field effect transistor or a normally off III-V transistor.

14. The circuit of claim 9, further comprising a first Schottky diode coupled between the third source/drain node and the fourth source/drain node.

15. The circuit of claim 9, further comprising:
a second enhancement mode transistor comprising a fifth source/drain node and a sixth source/drain node, and a fourth gate, wherein the fifth source/drain node is coupled to the second source/drain node.

16. The circuit of claim 15, wherein the sixth source/drain node is coupled to a second potential node, the circuit further comprising a second diode coupled between the second gate and a second potential node.

17. The circuit of claim 15, wherein the first, the second, the third, and the fourth gates are coupled to different potential nodes that are configured to be independently controlled.

18. The circuit of claim 17, wherein the third gate and the first gate are coupled to separate potential nodes of a first controller, and wherein the fourth gate and the second gate are coupled to separate potential nodes of a second controller.

19. The circuit of claim 18, wherein the first controller and the second controller are part of an integrated controller.

20. A semiconductor device comprising:
a bidirectional high electron mobility transistor comprising a first source/drain node, a second source/drain node, a first gate, and a second gate isolated from the first gate, wherein the high electron mobility transistor is a normally on transistor;
a first normally-off transistor comprising a third source/drain node and a fourth source/drain node, a first body, and a third gate, wherein the third source/drain node is coupled to the first source/drain node, wherein the fourth source/drain node is directly connected to the first body; and
a second normally-off transistor comprising a fifth source/drain node and a sixth source/drain node, a second body, and a fourth gate, wherein the fifth source/drain node is coupled to the second source/drain node, wherein the sixth source/drain node is directly connected to the second body.

21. The semiconductor device of claim 20, wherein the first, the second, the third, and the fourth gates are coupled to different potential nodes that are independently controlled.

22. The semiconductor device of claim 21, wherein the third gate and the first gate are coupled to separate potential nodes of a first controller, and wherein the fourth gate and the second gate are coupled to separate potential nodes of a second controller.

23. The semiconductor device of claim 20, wherein the fourth source/drain node is coupled to a first side potential node, wherein the sixth source/drain node is coupled to a second side potential node.

24. The semiconductor device of claim 23, further comprising a first diode coupled between the first gate and the first side potential node and a second diode coupled between the second gate and the second side potential node.

25. The semiconductor device of claim 23, wherein the first normally-off transistor and the second normally-off transistor comprise p-type field effect transistors.

26. The semiconductor device of claim 20, wherein each of the first normally-off transistor and the second normally-off transistor comprises an n-type field effect transistor.

27. The semiconductor device of claim 20, wherein the high electron mobility transistor is disposed in or over a first substrate, wherein the first normally-off transistor is disposed in or over a second substrate different from the first substrate.

28. The semiconductor device of claim 20, wherein the high electron mobility transistor and the first normally-off transistor are disposed in or over a same substrate.

29. The device of claim 1, wherein the first FET and the second FET are low voltage transistors configured to operate at a lower voltage than an operating voltage of the III-V HEMT.

30. The semiconductor device of claim 20, wherein the third gate and the first gate are only coupled to separate potential nodes of a first controller, and wherein the fourth gate and the second gate are only coupled to separate potential nodes of a second controller, the first gate being independently controlled from the second gate.

* * * * *